United States Patent
Peng et al.

(10) Patent No.: US 10,218,309 B2
(45) Date of Patent: Feb. 26, 2019

(54) FAST START-UP SINGLE PIN CRYSTAL OSCILLATION APPARATUS AND OPERATION METHOD THEREOF

(71) Applicant: EGREEN TECHNOLOGY INC., Taoyuan (TW)

(72) Inventors: Sheng Yu Peng, Taoyuan (TW); Sheng-Cheng Lee, Taoyuan (TW)

(73) Assignee: TRITAN TECHNOLOGY INC., Hsinchu County (TW)

(*) Notice: Subject to any disclaimer, the term of this patent is extended or adjusted under 35 U.S.C. 154(b) by 135 days.

(21) Appl. No.: 15/630,598

(22) Filed: Jun. 22, 2017

(65) Prior Publication Data
US 2018/0375473 A1 Dec. 27, 2018

(51) Int. Cl.
G04F 5/06 (2006.01)
H03K 3/354 (2006.01)
H03B 5/36 (2006.01)
H03K 5/24 (2006.01)

(52) U.S. Cl.
CPC ............... *H03B 5/364* (2013.01); *H03K 5/24* (2013.01)

(58) Field of Classification Search
CPC .................................. H03B 5/364; H03K 5/24
USPC ......................... 331/116 R, 116 FE, 154, 158
See application file for complete search history.

(56) References Cited

U.S. PATENT DOCUMENTS 6,111,473 A * 8/2000 Van Den Homberg ..................... H03B 5/364
331/116 FE
2018/0302034 A1* 10/2018 Ding ...................... H03B 5/362

* cited by examiner

*Primary Examiner* — Richard Tan
(74) *Attorney, Agent, or Firm* — Lin & Associates Intellectual Property, Inc.

(57) ABSTRACT

The invention disclosed fast start-up single-pin crystal oscillation apparatus and operation method thereof. The apparatus comprises a comparator, an envelope detector, a trigger, a crystal, a finite state machine, an amplifier gain module, a load capacitor module and a bias resistor. Compared to prior arts, the invention uses a single-pin oscillator structure to remove two external load capacitors, reduces start-up time, increase negative resistance, reduce load capacitor, and uses fast start-up algorithm to make the oscillation circuit operating at optimal power-consumption.

9 Claims, 5 Drawing Sheets

FAST START-UP SINGLE PIN CRYSTAL OSCILLATION APPARATUS AND OPERATION METHOD THEREOF

TECHNICAL FIELD

The technical field generally relates to a field of oscillator, and in particular, to a fast start-up single pin oscillation apparatus and operation method thereof.

BACKGROUND

In internet-of-things (IoT) application, the devices frequently switch between a standby mode and an operation mode. When the device enters the operation mode, the crystal oscillation circuit will restart-up and generates an accurate system clock for the system operation. Moreover, in IoT application, the low power-consumption and bill-of-materials (BOM) are major design indexes. In the conventional crystal oscillation circuit, the start-up time is often long and needs two pins to connect with an external load capacitor. As a result, both the overall system power-consumption and the BOM cost will increase.

The crystal oscillator is a collective term for oscillators of the resonant cavity type, and is often made with crystals with piezoelectric effect. Because of the property of highly selective in frequency, the crystal oscillator can generate highly accurate and highly stable frequency signals, and is widely used in microprocessor, controller, clocks, communication equipment, and so on. The main function of the crystal oscillator is to generate an original clock frequency, and by multiplying or dividing the frequency, various frequencies can be generated for various buses in a computer system. As such, the crystal oscillator is often used to substitute the LC (inductor and capacitor) resonant circuit and filters. As the crystal usually has high quality factor, light in weight and small in size, reliable, able to generate accurate and stable frequency, and so on, the crystal oscillator is often applied to devices demanding high frequency accuracy.

The known crystal oscillator usually has a start-up time in the order of milliseconds. In the systems that require frequent start-up and operate in short duration, the long start-up time occupies a large portion of system operation time, and consumes a large portion of power. As such, the long start-up time has become an issue for the contemporary applications.

FIG. 1 shows a schematic view of the structure of a conventional crystal oscillation circuit, formed by two capacitors C1, C2 and a crystal oscillator. A circuit of this type requires two pins to connect with the external load capacitor, and results in long start-up time. In other words, many cycles of oscillations must be passed before the output signal to reach pre-defined amplitude for generating a clock output. Therefore, the circuit performance is relatively restricted. Moreover, two external load capacitors (C1, C2) also add to the additional BOM cost as well as the size and area of the circuit. With the power consumption issues and the aforementioned disadvantages, it is imperative to devise a fast start-up single pin oscillation apparatus for the advance of contemporary applications.

SUMMARY

An object of the present invention is to provide a fast start-up circuit for crystal oscillator, a single pin oscillation apparatus and operation method thereof.

The present invention provides a fast start-up and stable crystal oscillation circuit to overcome the slow start-up issue in conventional crystal oscillator, able to shorten the start-up time and devise a new power-saving strategy for the low power consumption electronic communication system The present invention provides a structure for single pin crystal oscillation circuit to overcome the issue of the necessity of external load capacitor, able to save the size and area of printed circuit board (PCB), and reduce the number of pins in packaging to reduce power consumption and manufacturing cost.

To achieve the aforementioned objects, the present invention provides a fast start-up single pin crystal oscillation apparatus, comprising a comparator, an envelope detector, a trigger, a crystal, a finite state machine, an amplifier gain module, a load capacitor module and a bias resistor; wherein, the comparator having a positive input end, a negative input end and an output end, with the positive input end for receiving a detection voltage signal, the negative input end for receiving a reference voltage signal, the comparator comparing the detection voltage signal and the reference voltage signal and the output end outputting a comparison voltage signal; the envelope detector being coupled to the comparator, for generating the detection voltage signal; the trigger being coupled to the envelope detector, for generating a clock signal; the crystal being coupled to the trigger, for generating an oscillation signal with an oscillation frequency; the finite state machine being coupled to the trigger, the comparator, the load capacitor module, and the amplifier gain module, for receiving the clock signal and the comparison voltage signal and outputting a load capacitor calibration signal and a gain amplifier calibration signal; the load capacitor module being coupled to the amplifier gain module; and the bias resistor being coupled in parallel to the crystal and the load capacitor module.

To achieve the aforementioned objects, the present invention also provides a fast start-up operation method, able to improve the gain (GM) of the circuit, and further increase the negative resistance and reduce load capacitance to overcome the restriction of the conventional crystal oscillator, to reduce the start-up time.

The present invention provides an operation method of fast start-up single pin crystal oscillation apparatus, comprising the steps of: starting apparatus; setting a value for a reference voltage signal; selecting a minimum for a load capacitance and a maximum for a gain; starting an envelope detector; when detecting a detection voltage signal having a value larger than the value for the reference voltage signal, proceeding to next step; loading an optimal load capacitance; when detecting the detection voltage signal having a value not less than the value for the reference voltage signal, proceeding to next step; when detecting the detection voltage signal having a value larger than the value of the reference voltage signal, shutting down an amplifier cell in a first amplifier cell array and an amplifier cell in a second amplifier cell array and performing detection again, when detecting the detection voltage signal having a value no larger than the value for the reference voltage signal, proceeding to next step; obtaining an optimal gain value; and turning off the apparatus.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 2:
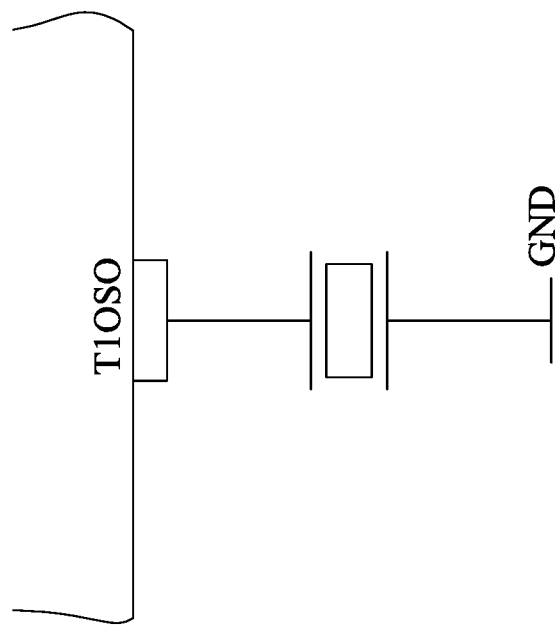
FIG. 2 shows a schematic view of the structure of the crystal oscillation apparatus of the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
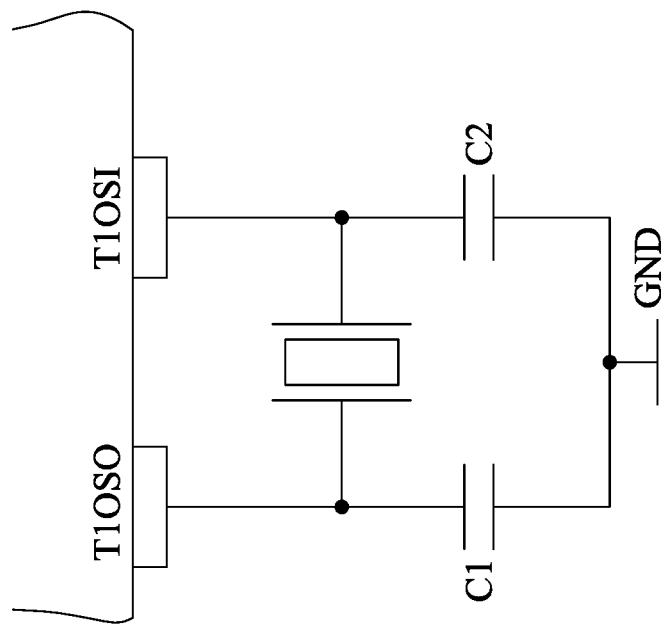
FIG. 1 shows a schematic view of the structure of the conventional crystal oscillator.
Figure 3:
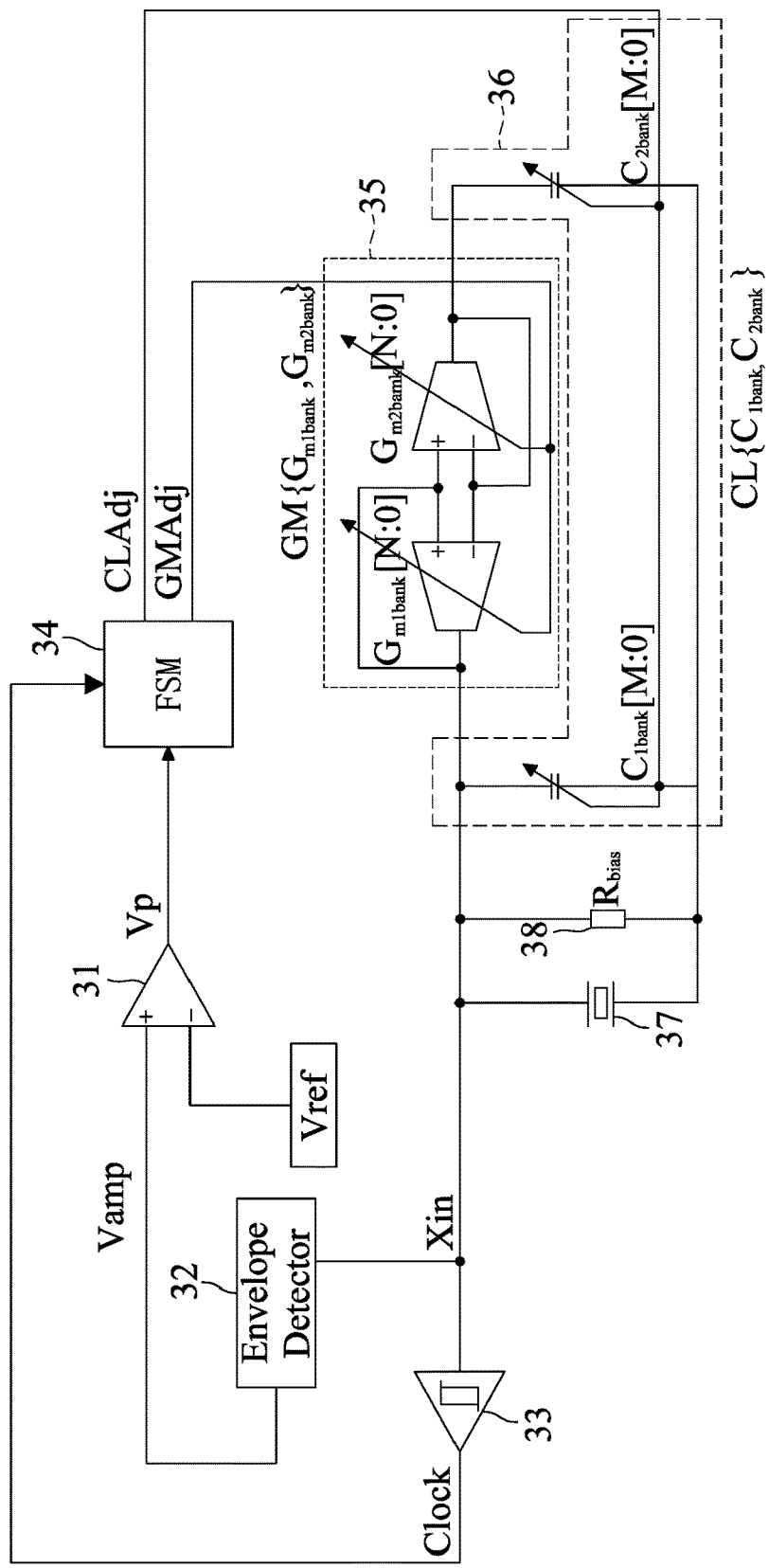
FIG. 3 shows a schematic view of the fast start-up single pin oscillation apparatus according to an embodiment of the present invention.

FIG. 2 shows a schematic view of the single pin crystal oscillation apparatus according to the present invention. As shown in FIG. 2, the present invention removes the two external load capacitors (C1 and C2) in FIG. 1. FIG. 3 shows a schematic view of the fast start-up single pin oscillation apparatus according to an embodiment of the present invention, which comprises: a comparator 31, an envelope detector 32, a trigger 33, a finite state machine 34, an amplifier gain module 35, a load capacitor module 36, a crystal 37 and a bias resistor 38.

Wherein, the comparator 31 has a positive input end (+), a negative input end (−) and an output end, with the positive input end for receiving a detection voltage signal Vamp, the negative input end for receiving a reference voltage signal Vref, the comparator 31 compares the detection voltage signal Vamp and the reference voltage signal Vref and the output end outputs a comparison voltage signal Vp. The envelope detector 32 is coupled to the comparator 31, for generating the detection voltage signal Vamp. The trigger 33 is coupled to the envelope detector 32, for generating a clock signal clock. The crystal 37 is coupled to the trigger 33, for generating an oscillation signal with an oscillation frequency Xin. The finite state machine (FSM) 34 is coupled to the trigger 33, the comparator 31, the load capacitor module 36, and the amplifier gain module 35, for receiving the clock signal clock and the comparison voltage signal Vp and outputting a load capacitor calibration signal CLAdj and an amplifier gain calibration signal GMAdj. The load capacitor module 36 is coupled to the amplifier gain module 35; and the bias resistor 38 Rbias is coupled in parallel to the crystal 37 and the load capacitor module 36.

As shown in FIG. 3, the trigger 33 is a Schmitt trigger.

As shown in FIG. 3, the amplifier gain module 35 is a cell array GM{Gm1bank, Gm2bank} which comprises a first amplifier cell Gm1bank[N:0] and a second amplifier cell Gm2bank[N:0], GM is a N-0 amplifier cell array.

As shown in FIG. 3, the load capacitor module 36 is a cell array CL{C1bank, C2bank} which comprises a first load capacitor cell C1bank[M:0] and a second load capacitor cell C2bank[M:0], CL is a M-0 load capacitor cell array.

As shown in FIG. 3, the amplifier gain calibration signal GMAdj controls the gain of the amplifier gain module 35.

A shown in FIG. 3, the load capacitor calibration signal CLAdj controls the capacitance of the load capacitor module 36.

Figure 4:
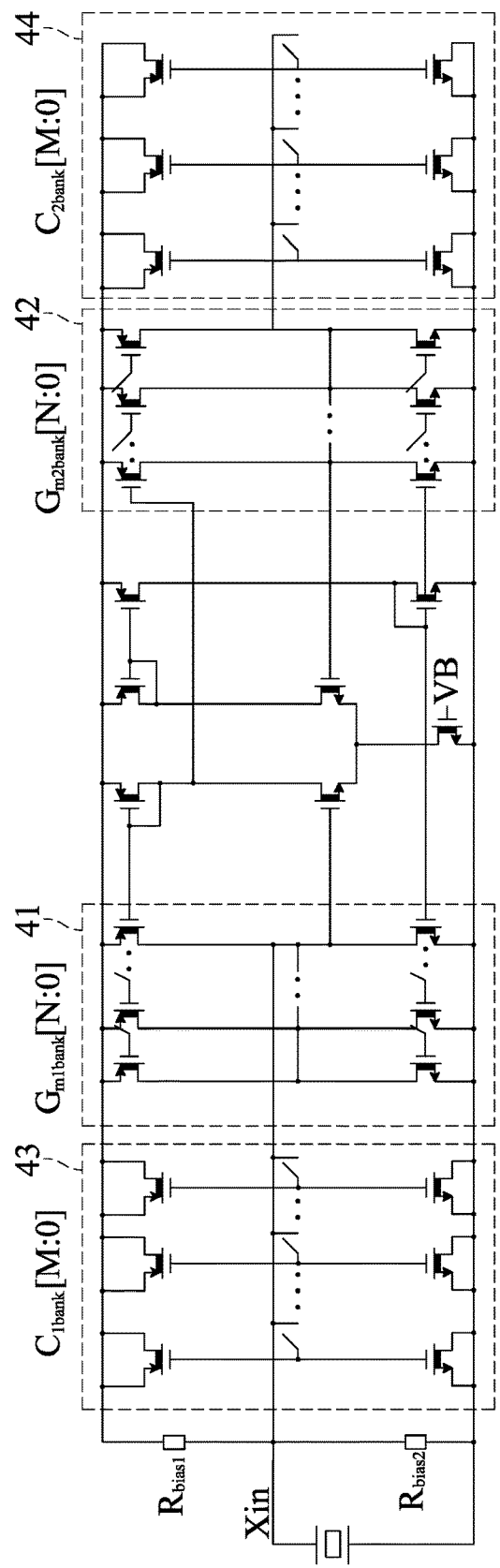
FIG. 4 shows a schematic view of a partial circuit of the fast start-up single pin oscillation apparatus according to an embodiment of the present invention.

Refer to FIG. 4. FIG. 4 shows a schematic view of a partial circuit of the fast start-up single pin oscillation apparatus according to an embodiment of the present invention, wherein the amplifier gain module 35 is a cell array GM{Gm1bank, Gm2bank} which comprises a first amplifier cell Gm1bank[N:0] 41 and a second amplifier cell Gm2bank[N:0] 42, GM is a N-0 cell array. The load capacitor module 36 is a cell array CL {C1bank, C2bank} which comprises a first load capacitor cell C1bank[M:0] 43 and a second load capacitor cell C2bank[M:0] 44, CL is a M-0 load capacitor cell array.

As shown in FIG. 4, the amplifier gain module 35 is formed by CMOS devices.

As shown in FIG. 4, the load capacitor module 36 is formed by CMOS devices.

As shown in FIG. 4, the operation principle is Gm2bank/C2bank>Gm1bank/C1bank.

Figure 5:
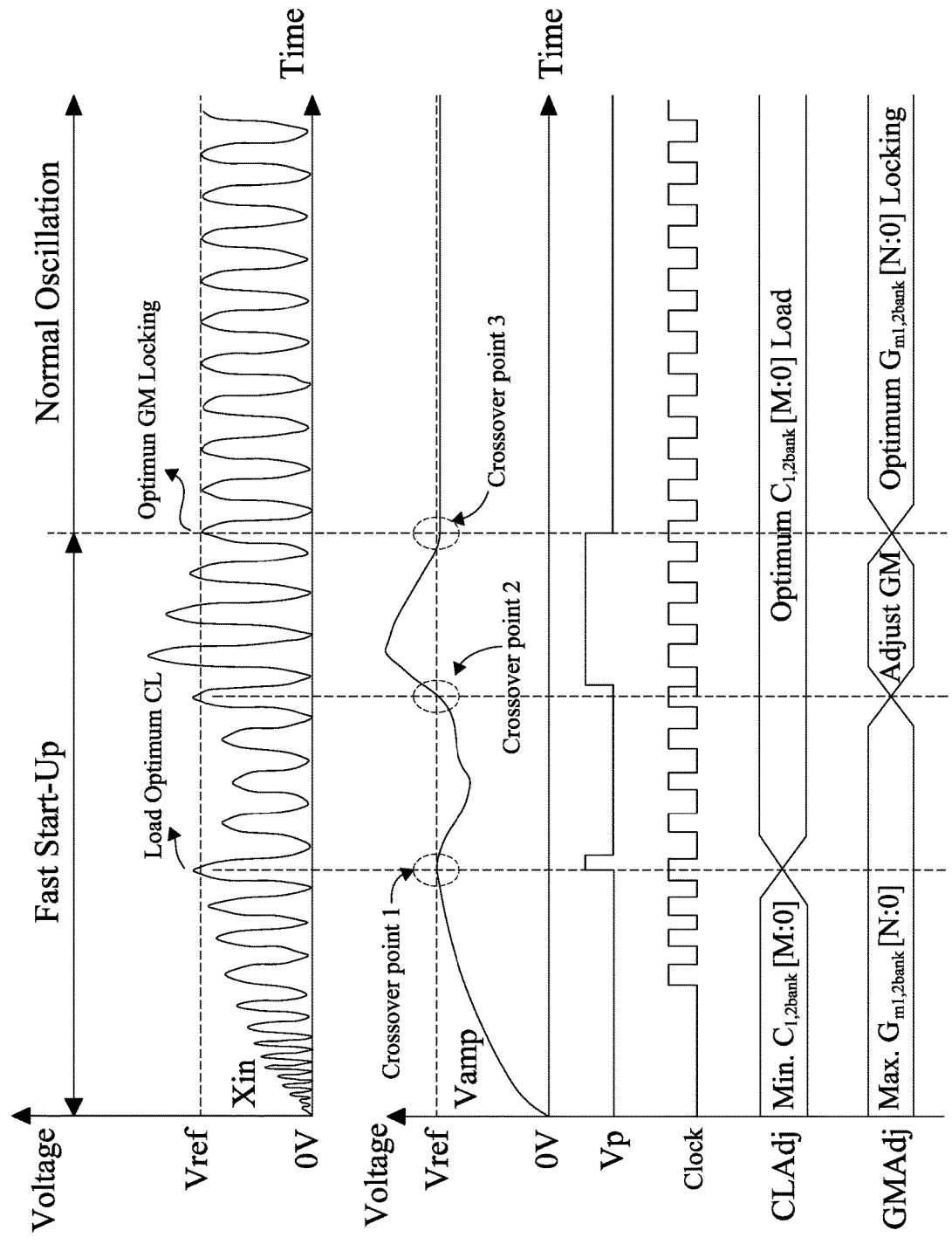
FIG. 5 shows a schematic view of waveform of the fast start-up single pin oscillation apparatus according to an embodiment of the present invention.

Refer to FIG. 5. FIG. 5 shows a schematic view of waveform of the fast start-up single pin oscillation apparatus according to an embodiment of the present invention, wherein the waveforms of the detection voltage signal Vamp, the reference voltage signal Vref, the comparison voltage signal Vp, the oscillator output signal Clock, the load capacitor calibration signal CLAdj, and the amplifier gain calibration signal GMAdj are shown. As shown in FIG. 5, at crossover point 1, the system loads in a load optimal CL value; between crossover point 2 and crossover point 3, the system adjusts the GM value; at crossover point 3, the system already obtains the optimal GM value.

Figure 6:
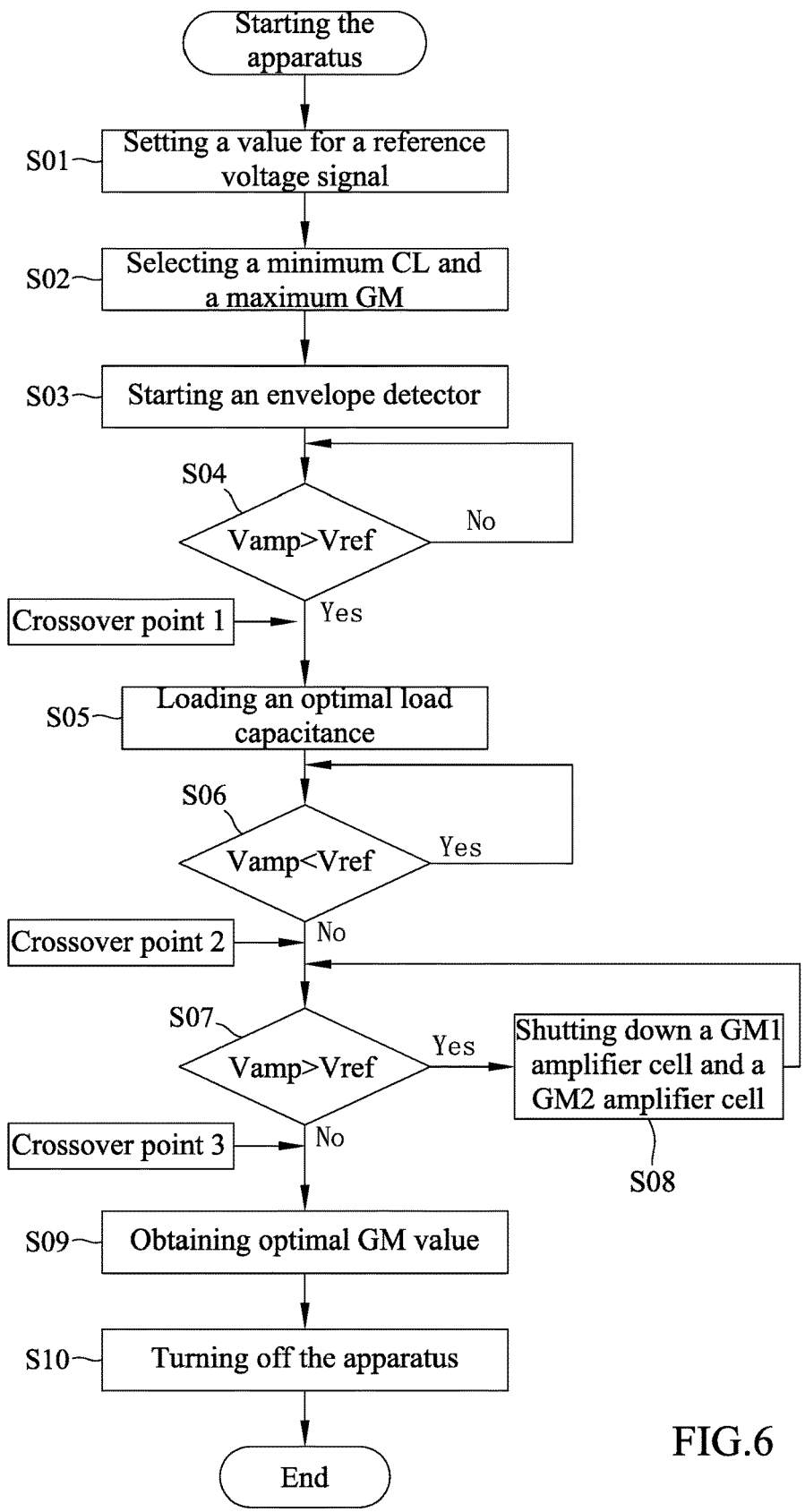
FIG. 6 shows a flowchart of operation method of the fast start-up single pin oscillation apparatus according to an embodiment of the present invention.

FIG. 6 shows a flowchart of operation method of the fast start-up single pin crystal oscillation apparatus according to an embodiment of the present invention. The operation method comprises the following steps.

Starting apparatus and oscillator signal Xin generating;

Setting a value for a reference voltage signal Vref (step S01);

Selecting a minimum for a load capacitance (minimum CL) and a maximum for a gain (maximum gain) (Step S02);

Starting an envelope detector 32 (step S03);

when detecting a detection voltage signal Vamp having a value larger than the value of the reference voltage signal Vref (step S04), proceeding to next step;

loading an optimal load capacitance (optimal CL value), wherein the optimal CL value can be obtained when shipped off from the foundry calibration previously (step S05);

when detecting the detection voltage signal Vamp having a value not less than the value of the reference voltage signal Vref (step S06), proceeding to next step;

when detecting the detection voltage signal Vamp having a value larger than the value of the reference voltage signal Vref (step S07), shutting down an amplifier cell in a first amplifier cell array and an amplifier cell in a second amplifier cell array (step S08) and performing detection again, when detecting the detection voltage signal Vamp having a value no larger than the value of the reference voltage signal Vref, proceeding to next step;

obtaining an optimal gain value (step S09); and turning off the start-up apparatus (step S10).

Compared to the known technology, the present invention provides the following advantages.

The present invention, by unique circuitry structure design, achieves the object of improving gain (GM), i.e., increasing negative resistance, reducing load capacitance, in initial state, the system able to select minimum C1 and maximum GM to speed up the start-up.

The present invention, by unique circuitry structure design, achieves using envelope detector and finite state machine to compute the optimal GM value to effectively reduce the power-consumption of the system.

The present invention, by unique circuitry structure design, achieves accelerating the start-up, shorten start-up time and increase effective operation time to increase response speed of the system to improve the data communication efficiency and applicable to various electronic products.

The present invention, by unique circuitry structure design, achieves a single pin crystal oscillation apparatus and reduces number of pins used to save PCB volume and size, leading to manufacturing cost down.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A fast start-up single pin crystal oscillation apparatus, comprising: a comparator, an envelope detector, a trigger, a crystal, a finite state machine, an amplifier gain module, a load capacitor module and a bias resistor; wherein:
    the comparator having a positive input end, a negative input end and an output end, with the positive input end for receiving a detection voltage signal, the negative input end for receiving a reference voltage signal, the comparator comparing the detection voltage signal and the reference voltage signal and the output end outputting a comparison voltage signal;
    the envelope detector being coupled to the comparator, for generating the detection voltage signal;
    the trigger being coupled to the envelope detector, for generating a clock signal;
    the crystal being coupled to the trigger, for generating an oscillation signal with an oscillation frequency;
    the finite state machine being coupled to the trigger, the comparator, the load capacitor module, and the amplifier gain module, for receiving the clock signal and the comparison voltage signal and outputting a load capacitor calibration signal and a gain amplifier calibration signal;
    the load capacitor module being coupled to the amplifier gain module; and
    the bias resistor being coupled in parallel to the crystal and the load capacitor module.

2. The fast start-up single pin crystal oscillation apparatus as claimed in claim 1, wherein the trigger is a Schmitt trigger.

3. The fast start-up single pin crystal oscillation apparatus as claimed in claim 1, wherein the amplifier gain module is a cell array which comprises a first amplifier cell array and a second amplifier cell array.

4. The fast start-up single pin crystal oscillation apparatus as claimed in claim 1, wherein the load capacitor module is a cell array which comprises a first load capacitor cell array and a second load capacitor cell array.

5. The fast start-up single pin crystal oscillation apparatus as claimed in claim 1, wherein the amplifier gain module is formed by CMOS devices.

6. The fast start-up single pin crystal oscillation apparatus as claimed in claim 1, wherein the load capacitor module is formed by CMOS devices.

7. The fast start-up single pin crystal oscillation apparatus as claimed in claim 1, wherein the amplifier gain calibration signal controls gain of the amplifier gain module.

8. The fast start-up single pin crystal oscillation apparatus as claimed in claim 1, wherein the load capacitor calibration signal controls capacitance of the load capacitor module.

9. An operation method of fast start-up single pin crystal oscillation apparatus, comprising the steps of:
    starting the fast start-up single pin crystal oscillation apparatus;
    setting a value for a reference voltage signal;
    selecting a minimum for a load capacitance and a maximum for a gain;
    starting an envelope detector;
    when detecting a detection voltage signal having a value larger than the value for the reference voltage signal, proceeding to next step;
    loading an optimal load capacitance;
    when detecting the detection voltage signal having a value not less than the value for the reference voltage signal, proceeding to next step;
    when detecting the detection voltage signal having a value larger than the value of the reference voltage signal, shutting down an amplifier cell in a first amplifier cell array and an amplifier cell in a second amplifier cell array and performing detection again,
    when detecting the detection voltage signal having a value no larger than the value for the reference voltage signal, proceeding to next step;
    obtaining an optimal gain value; and
    turning off the fast start-up single pin crystal oscillation apparatus.

* * * * *